(12) United States Patent
Wang et al.

(10) Patent No.: US 8,751,904 B2
(45) Date of Patent: Jun. 10, 2014

(54) CONTROLLING METHODS AND CONTROLLERS UTILIZED IN FLASH MEMORY DEVICE FOR REFERRING TO DATA COMPRESSION RESULT TO ADJUST ECC PROTECTION CAPABILITY

(75) Inventors: Wen-Long Wang, Hsinchu (TW); Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 303 days.

(21) Appl. No.: 13/187,499

(22) Filed: Jul. 20, 2011

(65) Prior Publication Data

US 2012/0023387 A1     Jan. 26, 2012

(30) Foreign Application Priority Data

Jul. 22, 2010   (TW) ................ 99124156 A

(51) Int. Cl.
    *G11C 29/00*   (2006.01)
(52) U.S. Cl.
    USPC .......................................... 714/773; 714/764
(58) Field of Classification Search
    USPC .......................................... 714/763, 764, 773
    See application file for complete search history.

(56) References Cited

U.S. PATENT DOCUMENTS

| 6,832,316 | B1 | 12/2004 | Sibert | |
| 6,842,793 | B2 | 1/2005 | Ohashi | |
| 2003/0023856 | A1 | 1/2003 | Horne | |
| 2005/0108555 | A1 | 5/2005 | Sibert | |
| 2007/0230698 | A1 | 10/2007 | Shamoon | |
| 2009/0268513 | A1* | 10/2009 | De Ambroggi et al. | 365/163 |
| 2010/0251066 | A1* | 9/2010 | Radke | 714/752 |
| 2011/0154158 | A1* | 6/2011 | Yurzola et al. | 714/758 |
| 2011/0320915 | A1* | 12/2011 | Khan | 714/773 |
| 2012/0260147 | A1* | 10/2012 | Perlmutter et al. | 714/763 |
| 2012/0284587 | A1* | 11/2012 | Yu et al. | 714/773 |

FOREIGN PATENT DOCUMENTS

| TW | I269154 | 12/2006 |
| TW | 200842893 | 11/2008 |
| WO | 2008070173 A1 | 6/2008 |

OTHER PUBLICATIONS

Chin-Hsing Chen & Chun-Ta Chen &Wen-Tzeng Huang, "The Real-Time Compression Layer for Flash Memory in Mobile Multimedia Devices," Mobile Networks and Applications, Dec. 2008, vol. 13, Issue 6, pp. 547-554.*

* cited by examiner

Primary Examiner — Cynthia Britt
(74) Attorney, Agent, or Firm — Winston Hsu; Scott Margo

(57) ABSTRACT

A controlling method utilized in a flash memory device includes: compressing first data received from a host to generate second data; generating record data according to the first data and the second data where the record data records error correct coding (ECC) control information at least; executing ECC protection upon specific data selected from the first and second data to generate third data; and writing the third data into the flash memory device.

18 Claims, 3 Drawing Sheets

CONTROLLING METHODS AND CONTROLLERS UTILIZED IN FLASH MEMORY DEVICE FOR REFERRING TO DATA COMPRESSION RESULT TO ADJUST ECC PROTECTION CAPABILITY

BACKGROUND OF THE INVENTION

1. Field of the Invention

The present invention relates to a flash memory device control mechanism, and more particularly, to a controlling method applied to a flash memory device and related controller thereof.

2. Description of the Prior Art

With the continuous development of flash memory technology in recent years, a variety of portable memory devices (e.g., memory cards complying with SD/MMC, CF, MS, XD standards) or solid state drives (SSDs) that include flash memory devices are widely applied in a variety of applications. Therefore, the access control of the flash memory devices within the memory devices is becoming a hot issue.

As to the common NAND flash memory devices, they are mainly categorized into two types of flash memory devices including single level cell (SLC) flash memory devices and multiple level cell (MLC) flash memory devices. Each transistor which is utilized as a memory cell within the SLC flash memory device has only two electric charge values for representing a logic value "0" and a logic value "1", respectively. Besides, regarding the MLC flash memory device, the storage capacity of each transistor which is utilized as a memory cell is fully utilized by using a higher driving voltage to thereby record two groups (or above) of bit information (00, 01, 11, 10) in one transistor via different voltage levels; theoretically, a recording density of the MLC flash memory device is twice as large as a recording density of the SLC flash memory device. It is good news to NAND flash memory device industry that has suffered bottleneck ever.

Compared with the SLC flash memory device, the MLC flash memory device has a lower price and provides a larger storage capacity within a limited region. Therefore, using MLC flash memory devices in portable memory devices shipped to the market has become a main trend. However, problems are emerging due to instability of the MLC flash memory device. In order to ensure that the access control of the flash memory within the memory device satisfies the related specification, the controller of the flash memory device generally includes some management mechanisms to manage access of the information properly.

According to the related technology, the memory device employing the management mechanism still has its shortcomings. For example, a user may continuously write in some data that has a specific data pattern according to his custom, but writing the specific data pattern is especially prone to having access errors (e.g., write error, read error, etc.). Though a randomizer is disposed in the memory device for adjusting the data to solve the problem, the adjusted data is not essentially random due to the use of a conventional low-cost design. Besides, while the cost of the MLC flash memory device is continuously decreasing, the characteristic of the MLC flash memory device is also degraded continuously, i.e., access errors are more probably to happen. Therefore, an innovative method is needed to properly manage the accessed data within the MLC flash memory device to thereby prevent errors from happening. Regarding the important data such as operation system information, a proper data management is especially required to decrease the occurrence probability of errors.

SUMMARY OF THE INVENTION

Therefore, one of the objectives of the present invention is to provide a controller utilized in the flash memory device and related controlling method thereof, for solving the problems encountered in the prior art to decrease the occurrence probability of access errors.

According to a first aspect of the present invention, a controlling method utilized in a flash memory device is revealed. The controlling method is utilized in data writing, and includes: generating a second data by compressing a first data received from a host; generating a record data according to the first data and the second data, wherein the record data records at least error correct coding (ECC) control information; generating a third data by executing an ECC protection upon at least a specific data selected from the first data and the second data; and writing the third data into the flash memory device.

According to a second aspect of the present invention, a controlling method utilized in a flash memory device is further revealed. The controlling method is utilized in data reading, and includes: reading a third data from the flash memory device, the third data including a record data, the record data recording compressing indication information and ECC control information; generating a second data by executing ECC decoding according to the recorded ECC control information and the third data; generating a first data to a host by decompressing the second data or outputting the second data to the host according to the recorded compressing indication information.

Moreover, according to a third aspect of the present invention, a controller utilized in a flash memory device is revealed. The controller is utilized in data writing, and includes a first processing circuit and a second processing circuit. The first compressing circuit compresses a first data received from a host to generate a second data, and generates a record data according to the first data and the second data, wherein the record data records at least ECC control information. The second processing circuit is coupled to the first processing circuit, for executing ECC protection upon at least a specific data selected from the first data and the second data according to the ECC control information, and writing the third information into the flash memory device.

Moreover, according to a fourth aspect of the present invention, a controller utilized in a flash memory device is revealed. The controller is utilized in data writing, and includes a first processing circuit and a second processing circuit. The second processing circuit reads a third data from the flash memory device. The third data includes a record data. The record data records compressing indication information and ECC control information. The second processing circuit generates a second data by executing ECC decoding according to the recorded ECC control information and the third data. The first processing circuit is coupled to the second processing circuit, for decompressing the second data according to the recorded compressing indication information to generate a first data to a host or output the second data to the host.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
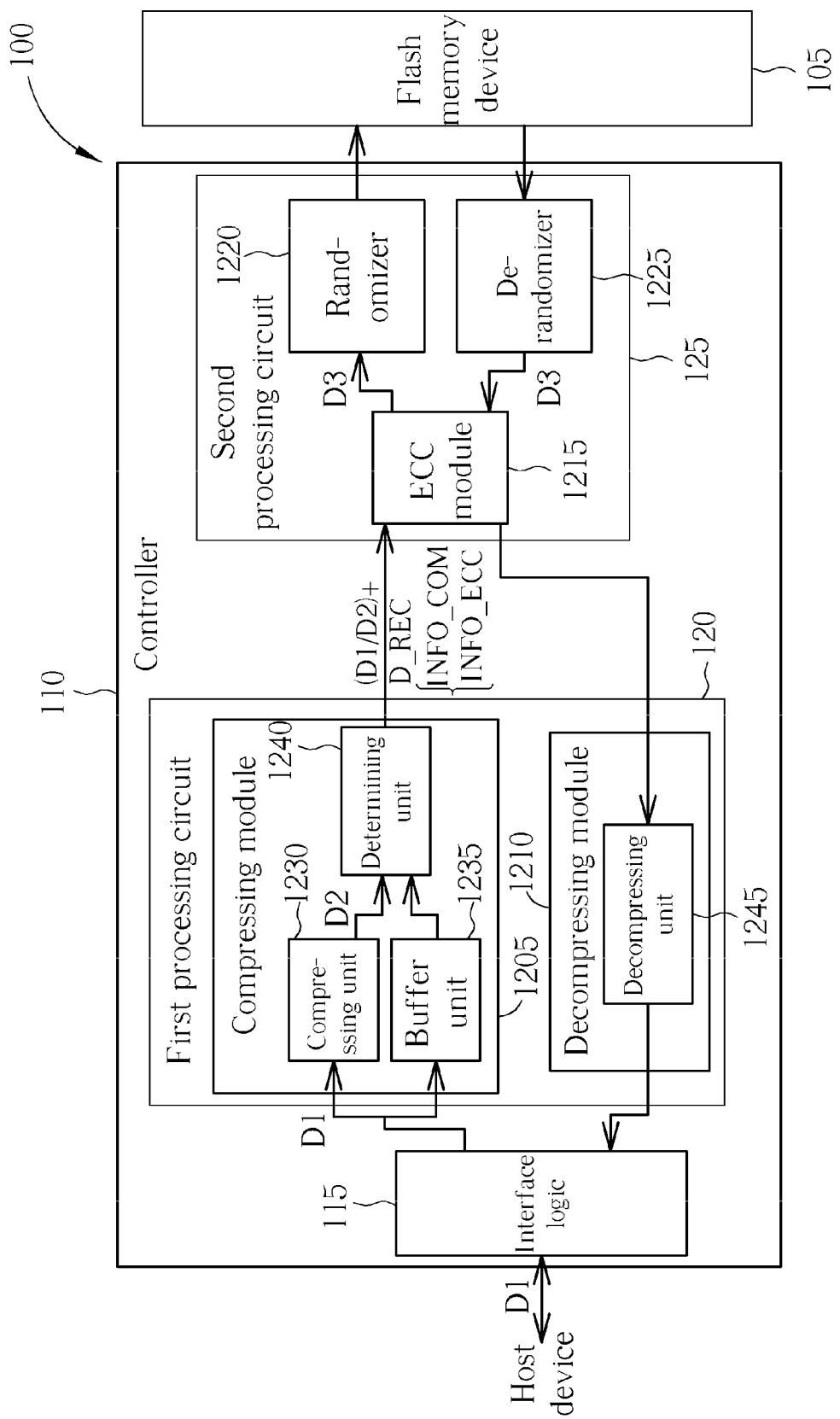
FIG. 1 is a diagram illustrating a memory device according to a preferred embodiment of the present invention.

Please refer to FIG. 1, which is a diagram illustrating a memory device 100 in a preferred embodiment of the present invention. In this embodiment, the memory device 100 may be a portable memory device, such as a memory card complying with SD/MMC, CF, MS, or XD standard, a universal serial bus flash drive (USB flash drive or USB flash disk), i.e., a portable disk, or a solid state drive (SSD); however, it is not meant to be a limitation of the present invention. The memory device 100 includes a flash memory device 105 and a controller 110 used for accessing the flash memory device 105. For example, the controller 110 is a memory controller. The controller 110 includes an interface logic 115, a first processing circuit 120, and a second processing circuit 125. The interface logic 115 receives a first data D1 from a host device. For example, the host device is a host computer (not shown in FIG. 1), and the first data D1 may be an audio/video data, a computer booting data or a common data. By way of example, in order to store the first data D1 into the flash memory device 105, the host device first transmits the first data D1 to the controller 110, and then the controller 110 writes the received data into the flash memory device 105. In the following, if the host device wants to read the first data D1, the controller 110 is informed by the host device to perform data reading operation. The controller 110 reads the first data D1 from the flash memory device 105, and transmits the first data D1 to the host device via the interface logic 115 after the first data D1 has been processed by the first processing circuit 120 and the second processing circuit 125. The operations of the first processing circuit 120 and the second processing circuit 125 are based on the data storing characteristic of the flash memory device 105, and are capable of avoiding errors (e.g., write error, read error, etc.) resulted from frequently writing some data with a specific data pattern. For example, the first data D1 to be stored by the host device has the specific data pattern mentioned above. With the help of the data processing operations performed by the first processing circuit 120 and the second processing circuit 125, the first data D1 may be converted into a data with a different data pattern and then stored into the flash memory device 105 for avoiding undesired storage errors. When the host device wants to read the stored first data D1, the first processing circuit 120 and the second processing circuit 125 perform reverse data processing operations upon the first data D1 read from the flash memory device 105 for converting the data pattern of the stored first data D1 into the original data pattern of the first data D1, and then the first data D1 with the recovered data pattern is output to the host device. As to the host device, errors will not occur when the data reading operation is performed.

The first processing circuit 120 includes a compressing module 1205 and a decompressing module 1210. Though the compressing module 1205 and the decompressing module 1210 are executing compressing operation and decompressing operation separately in this exemplary embodiment, it is only for facilitating reader's comprehension of the disclosure only. Actually, in other exemplary embodiments, the compressing operation and the decompressing operation may be performed in the same circuit module. Therefore, the compressing module 1205 and the decompressing module 1210 in this exemplary embodiment are not limitations to the present invention.

When the host device wants to write the first data D1, the first data D1 is processed by the compressing module 1205; on the contrary, when the host device wants to read a data from the flash memory device 105, the data read from the flash memory device 105 is processed by the decompressing module 1210, and then the processed data (i.e., the decompressed data) is transmitted to the host device. The second processing circuit 125 includes an error correct coding (ECC) module 1215, a randomizer 1220 and a de-randomizer 1225. When the host device writes the first data D1, the first processing circuit 120 outputs a specific data, the ECC module 1215 in the second processing circuit 1205 receives the specific data from the first processing circuit 120 and executes ECC protection upon the received specific data to thereby generate a third data D3, and then the randomizer 1220 executes data shaping upon bits of the third data D3. The objective of the data shaping is to avoid access errors resulted from storing the third data D3 with a series of 1's or 0's (or other data pattern that probably causes an access error) into the flash memory device 105. Therefore, the randomizer 1220 shapes the bits of the third data D3 as a data pattern with randomly distributed and discontinuous bits 1's and 0's, and then the shaped data pattern is stored into a storage block of the flash memory device 105. Moreover, when the host device reads a data (e.g., the shaped data pattern) from the flash memory device 105, the de-randomizer 1225 first executes reverse data shaping upon the read data (e.g. the data pattern with randomly distributed and discontinuous bits 1's and 0's is shaped in a reverse manner to therefore become ECC-protected data bits including consecutive 1's and 0's). Next, the ECC module 1215 further executes an ECC decoding operation upon the shaped ECC-protected data bits, and then transmits the decoded data to the first processing circuit 120. Though the randomizer 1220 and the de-randomizer 1225 in this exemplary embodiment are executing data shaping operation and reverse data shaping operation separately, it is for facilitating reader's comprehension of the disclosure only. Actually, in other exemplary embodiments, the two operations may be performed by the same circuit. Therefore, the randomizer 1220 and the de-randomizer 1225 in this exemplary embodiment are not limitations to the present invention.

In detail, the compressing module 1205 includes a compressing unit 1230, a buffer unit 1235 and a determining unit 1240, and the decompressing module 1210 includes at least a decompressing unit 1245. When the host device writes the first data D1 into the flash memory device 105, the compressing unit 1230 compresses the content of the first data D1 to generate a second data D2, and the buffer unit 1235 stores the first data D1 received from another data path temporarily. Next, the determining unit 1240 compares the data amount of the first data D1 and the second data D2 to determine the compression ratio, and refers to the determined compression ratio for determining which one of the first data D1 and the second data D2 is selected as the specific data to be output. Please note that when the data amount of the first data D1 is constant/fixed or can be known by the controller 110, the determining unit 1240 may compare a predetermined standard data amount with the data amount of the second data D2 to determine the compression ratio without referring to the data amount of the first data D1.

When the compression ratio is too low or the data amount of the compressed data (i.e., the second data D2) is even larger than the data amount of the first data D1, the determining unit 1240 determines that the first data D1 that is not compressed is selected as the specific data to be output, and ignores the second data D2 that is stored in the buffer unit 1235 temporarily. It is because the first data D1 may be a compressed audio/video data, and the compression ratio of the first data D1 may not be increased via performing the compressing operation several times. In a worst case, the data amount of the second data D2 may be even larger than the data amount of the first data D1. Therefore, when determining that the compression ratio is too low, the determining unit 1240 outputs the first data D1 as the specific data to the second processing circuit 125; on the contrary, when determining that the compression ratio is not too low, the determining unit 1240 outputs the compressed data (i.e., the second data D2) as the specific data to the second processing circuit 125.

When outputting the specific data, the determining unit 1240 also generates a record data D_REC according to the first data D1 and the second data D2 (for example, the record data D_REC is correspondingly generated by referring to the specific data determined from the first data D1 and the second data D2). The record data D_REC and the specific data (i.e., one of the first data D1 and the second data D2) will be output to the second processing circuit 125 simultaneously, wherein the record data D_REC records at least compressing indication information INFO_COM and ECC control information INFO_ECC. The compressing indication information INFO_COM at least indicates if the specific data is a compressed data, and also indicates the compression ratio if the specific data is a compressed data. The ECC control information INFO_ECC at least indicates a bit number of the ECC code that is allowed to be utilized by the ECC protection applied to the specific data (e.g., indicates a bit number of a parity check code of the ECC code).

The bit number of the ECC code recorded in the ECC control information INFO_ECC may be varied with the variation of the compression ratio corresponding to the second data D2 (i.e. the difference value between the data amounts of the first data D1 and the second data D2), thereby dynamically varying the ECC protection capability. When the difference value between the data amounts of the first data D1 and the second data D2 is smaller than a specific difference value (i.e., the compression ratio is too low), the bit number of the ECC code utilized in the corresponding ECC protection is smaller than a specific bit number (e.g., a general ECC protection is employed). On the contrary, when the difference value between the data amount of the first data D1 and the second data D2 is larger than the specific difference value (i.e., the compression ratio is higher), the bit number of the ECC code utilized in a corresponding ECC protection is larger than the specific bit number (e.g., an enhanced ECC protection is employed).

Figure 2:
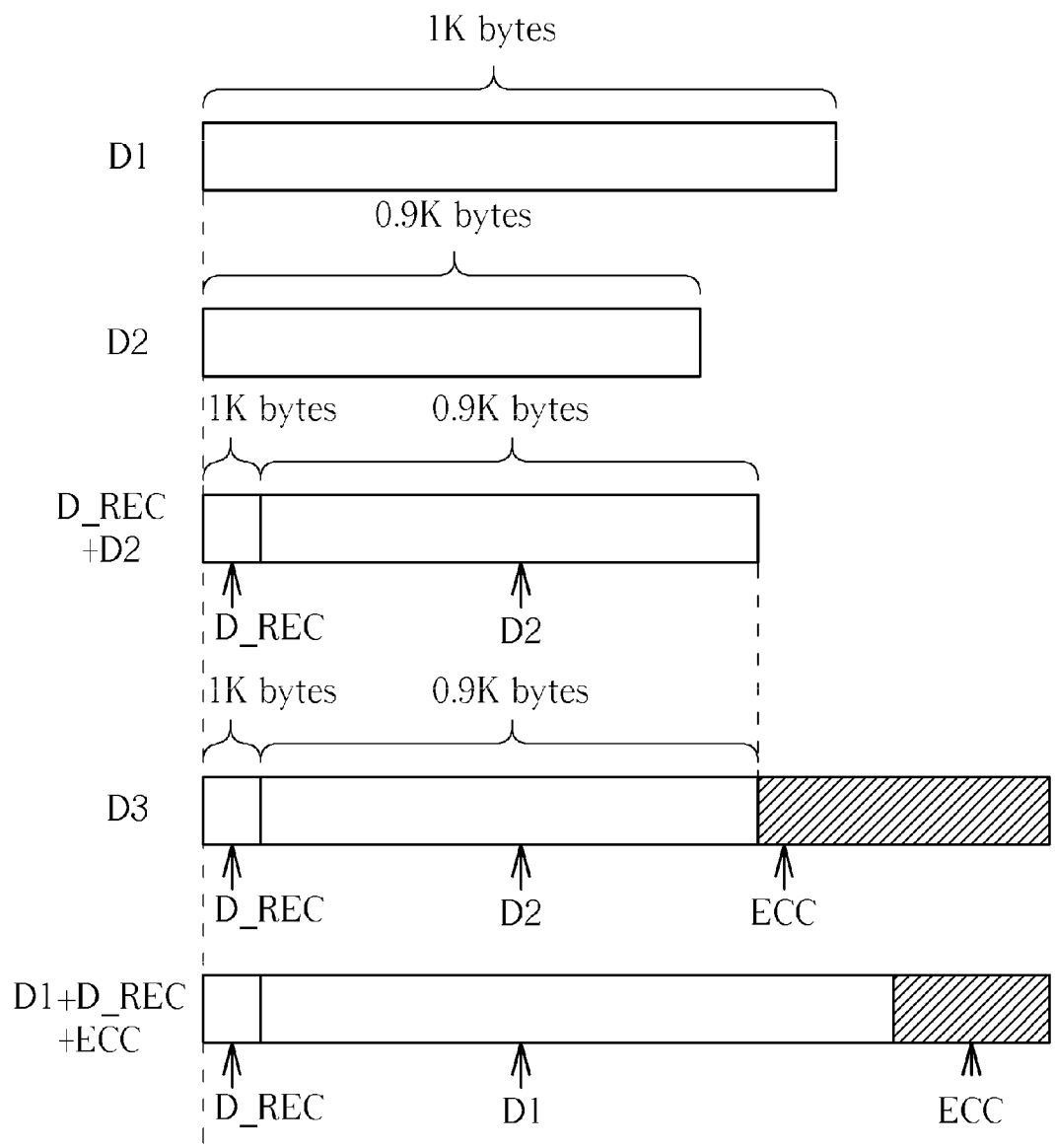
FIG. 2 is a diagram illustrating the controller shown in FIG. 1 executing data processing upon the content of the first data during the data writing operation.

Please refer to FIG. 2, which is a diagram illustrating the controller 110 shown in FIG. 1 executing data processing upon the content of first data D1 during a writing operation. In this exemplary embodiment, the first data D1 received from the host has a data amount of 1K bytes (Please note that the data amount of the first data D1 in this exemplary embodiment is determined according to the minimum ECC protection unit specified by the flash memory device. Those skilled in the art have to change the data amount of the first data D1 according to different standards of flash memory devices). The second data D2 generated from compressing the first data D1 by the compressing unit 1230 has a data amount of 0.9K bytes. That is, the compression ratio is 10%. The determining unit 1240 selects the second data D2 as the specific data to be output, and generates a record data D_REC whose data amount is 1 byte to the ECC module 1215. Please the size of the record data D_REC is only an exemplary embodiment, and is not a limitation to the present invention. The compressing indication information INFO_COM in the record data D_REC records that the specific data is a compressed data and the compression ratio is 10%. The ECC control information INFO_ECC records the bit number of the ECC protection utilized by the following ECC module 1215. The objective of the present invention is to enhance the effect of the ECC protection. Therefore, the bit space saved by data compression is utilized by the ECC protection. That is, more ECC bits may be utilized for ECC protection due to compressed data. Please note that the record data D_REC may be attached to the head of the second data D2. So, when reading operation is executed later, the compression and ECC information may be determined rapidly.

In another exemplary embodiment, the first data D1 received from the host device has a data amount of 1K bytes, while the second data D2 generated from compressing the first data D1 by the compressing unit 1230 has a data amount of 1.1K bytes. That is, the compression ratio is 0.5%. Since the data amount of the second data D2 is larger than the data amount of the first data D1, the determining unit 1240 selects the first data D1 as the specific data to be output, and generates a record data D_REC whose data amount is 1 byte to the ECC module 1215. Please note that the size of the record data D_REC is only an exemplary embodiment, and is not a limitation to the present invention. The compressing indication information INFO_COM in the record data D_REC records that the specific data is a non-compressed data. Thus, the compression ratio of the specific data is 0%. The ECC control information INFO_ECC records the bit number of the ECC protection utilized by the following ECC module 1215. Please note that the record data D_REC may be attached at the head of the first data D1. So, when the reading operation is executed later, the compression and ECC information may be determined rapidly.

As shown in FIG. 2, if the specific data is the second data D2 which is a compressed data, the ECC module 1215 executes dynamic ECC protection upon the specific data (i.e. the second data D2) and the record data D_REC by utilizing more bits. The bit number of the ECC code in a third data D3 output by the ECC module 1215 is more than the bit number used by ECC protection applied to the first data D1, so the effect of the ECC protection is better. If the specific data is the first data D1 that is not compressed, the ECC module 1215 executes the ECC protection upon the specific data by utilizing fewer bits, which may be regarded as a basic bit number utilized under a basic ECC protection mode. When the host device writes a data pattern including a series of continuous bits 1's or 0's (i.e., a data pattern that probably causes access errors) to the flash memory device 105, the first processing circuit 120 in the exemplary embodiment of the present invention may first compress the data pattern to generate a compressed data pattern. Therefore, the data pattern including a series of continuous bits 1's or 0's will be first compressed and converted into the compressed data pattern which does not have a series of continuous bits 1's or 0's. In this way, the occurrence probability of access errors is decreased. In the following, since the data is compressed, the ECC module 1215 may execute ECC protection by utilizing more bits, which further decreases the occurrence probability of access errors that cannot be corrected. Finally, the randomizer 1220 executes data shaping upon the data pattern output by the ECC module 1215, and the shaped data is stored into the flash memory device 105. So, when the controller 110 accesses the flash memory device 105, the occurrence probability of access errors may be decreased greatly.

Besides, it should be noted that, in this exemplary embodiment, the data amount of the data which is generated after executing the ECC protection and data shaping respectively upon the first data D1 that is not compressed and the record data D_REC and the data amount of the data which is generated after executing the ECC protection and data shaping respectively upon the second data D2 which is compressed and the record data D_REC are almost the same or even identical to each other. That is, the data amount of the third data D3 is equal to the data amount of total data generated from executing ECC protection upon the first data D1 and the record data D_REC. However, having equalized data amounts is not a limitation to the present invention. Since the minimum unit in writing the flash memory device is one page. That is, when the writing operation is performed, the data amount written into the flash memory device in each data writing is related to the page size of the flash memory device. For example, one page of the flash memory device includes 4 sectors, and each sector is the minimum ECC protection unit specified by the flash memory device. In general, the sum of data amount generated by executing the ECC protection and the data amount of other access control data is equal to a size of one sector. So, in the following access operation, the problem caused by an inconsistency between the data amount to be written into the flash memory device and the minimum unit in writing the flash memory device will not occur.

As to data reading, the de-randomizer 1225 executes reverse data shaping upon the data pattern read from the flash memory device 105 to generate a third data D3. Since the record data D_REC in the third data D3 records the ECC control information INFO_ECC, the ECC module 1215 may execute ECC decoding according to the recorded ECC control information INFO_ECC and the third data D3 to thereby generate a specific data, wherein the ECC control information INFO_ECC indicates a bit number of ECC code utilized in the ECC decoding. As mentioned above, the bit number may be varied according to the variation of the compression ratio of each data. For example, the de-randomizer 1225 further reads another data pattern from the flash memory device 105 and executes reverse data shaping upon the data pattern to generate a fourth data D4. The record data in the fourth data D4 also records ECC control information, wherein the ECC control information of the fourth data D4 and the ECC control information of the third data D3 may indicate different bit numbers of ECC codes, respectively.

Moreover, this specific data may be the second data D2 that is compressed or the first data D1 that is not compressed. Since the record data D_REC in the third data D3 also records the compressing indication information INFO_COM, the decompressing module 1210 which is coupled to the first processing circuit 120 may determine whether to execute decompression upon the specific data or directly output the specific data to the host device by referring to the indication derived from the compressing indication information INFO_COM (i.e., judging if the specific data is a compressed data). In other words, if the specific data is the second data D2, the decompressing module 1210 decompresses the specific data to generate the first data D1 to the host device, and if the specific data is the first data D1, the decompressing module 1210 directly outputs the specific data to the host device. Regarding the host device, it knows a logical address at which the first data D1 is stored in the flash memory device 105, but does not know which data pattern is stored in the physical address of the flash memory device 105 actually. However, when reading a data that is previously written into the flash memory device 105, the host device is capable of obtaining the stored data correctly. As mentioned above, with the help of the data processing operations performed by the first processing circuit 120 and the second processing circuit 125, more bit space derived from the compressing data may allow the ECC protection to use more bits. Therefore, the occurrence probability of access errors is greatly decreased.

It should be noted that the randomizer 1220 and the de-randomizer 1225 in this exemplary embodiment are optional circuit components. In other words, in other exemplary embodiments, the randomizer 1220 and the de-randomizer 1225 may be omitted. Therefore, when the controller 110 accesses the flash memory device 105, it writes the aforementioned third data D3 into the flash memory device 105 and reads the third data D3 from the flash memory device 105, rather than accesses the shaped data pattern generated from data shaping. Omitting the randomizer 1220 and the de-randomizer 1225 may reduce the cost of the circuit. As to the data access, most part of the third data has been compressed and encoded with enhanced ECC protection. Generally, the continuous bits 1's and 0's will not exist in the compressed data, so executing data compression upon data may have the same effect as data shaping. Therefore, even though data shaping operation is omitted, the occurrence probability of access errors is reduced to an acceptable level.

Moreover, the ECC module 1215 may further execute ECC protection upon data by dynamically using different ECC bits according to the importance of the specific data. For example, when the determining unit 1240 generates the ECC control information INFO_ECC in the record data D_REC, it may determine the bit number utilized in the ECC protection that is recorded in the ECC control information INFO_ECC according to the comparing result between the first data D1 and the second data D2 (i.e. the compression rate) and the importance of the specific data. Alternatively, in another exemplary embodiment, besides referring to the bit number utilized in the ECC protection that is determined by the determining unit 1240 according to the comparing result between the first data D1 and the second data D2, the ECC module 1215 may fine tune the bit number utilized in the ECC protection by referring to the importance of the specific data. For example, when the specific data is categorized as an important data (e.g., a computer booting data), the determining unit 1240 may determine the final bit number utilized in the ECC protection, or the ECC module 1215 may adjust the bit number utilized in the ECC protection such that the ECC module 1215 may utilize more bits to execute ECC protection upon the data. When the specific data is categorized as a less important data, the ECC module 1215 utilizes fewer bits (i.e., a basic bit number) to execute ECC protection upon the data. In general, important data, such as system operation data, computer booting data, etc., have a higher compression ratio. The controller 110 may also analyze the importance of the data via other manners, or the host device may directly inform the controller 110 of the importance of data.

Figure 3:
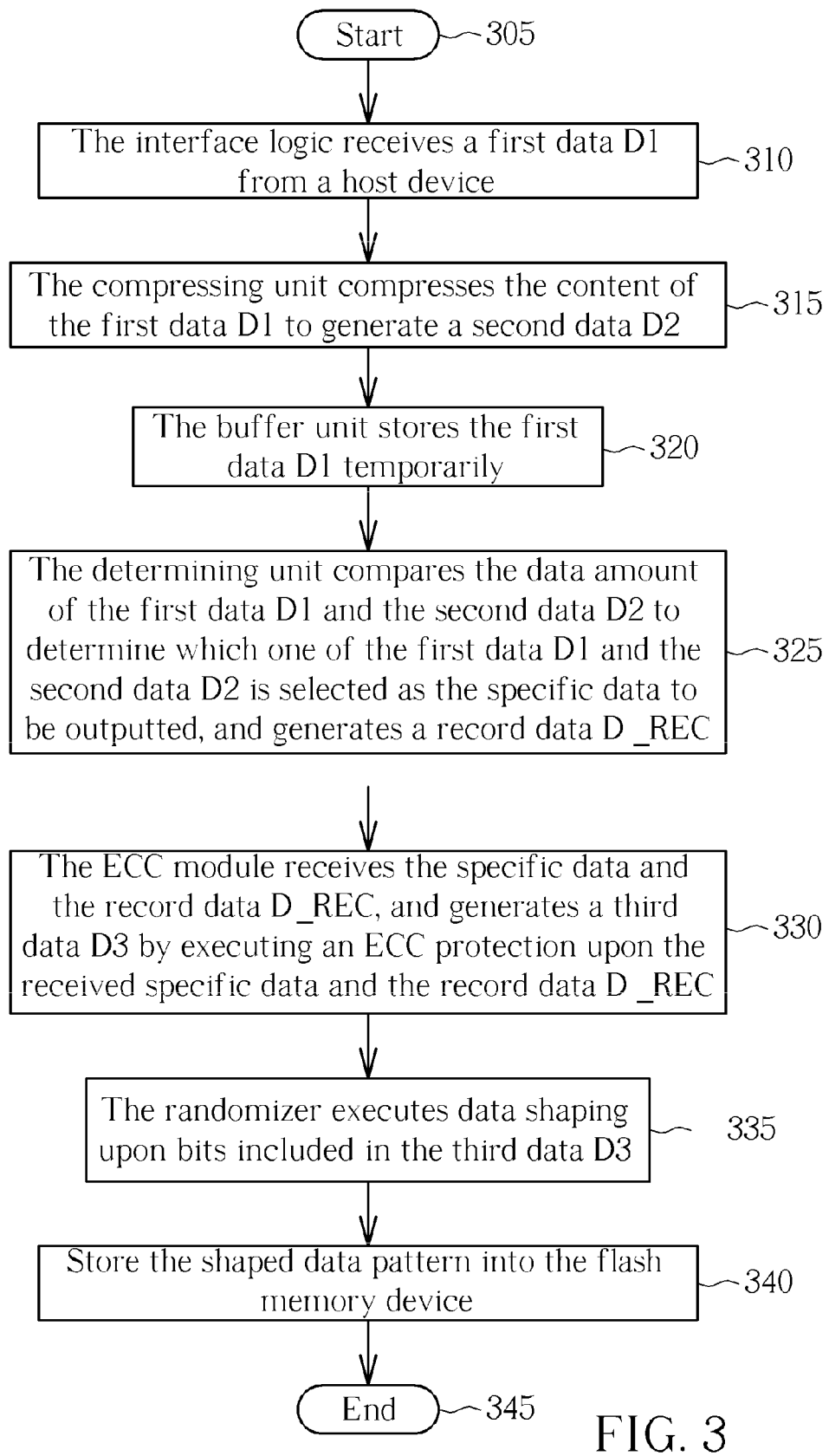
FIG. 3 is a flowchart illustrating the memory device shown in FIG. 1 executing data writing operation.

To more clearly understand the operation of each circuit component in the memory device 100, please refer to FIG. 3, which is a flowchart illustrating the memory device 100 shown in FIG. 1 executing data writing operation. For brevity, the flow of data reading operation is omitted here. If the result is substantially the same, the steps are not required to be executed in the exact order shown in FIG. 3. Besides, the steps in FIG. 3 are not necessarily to be executed. That is, other steps may be inserted into the exemplary flow. The steps of the exemplary flow are detailed below:

Step 305: Start;

Step 310: The interface logic 115 receives a first data D1 from a host device;

Step 315: The compressing unit 1230 compresses the content of the first data D1 to generate a second data D2;

Step 320: The buffer unit 1235 stores the first data D1 temporarily;

Step 325: The determining unit 1240 compares the data amount of the first data D1 and the second data D2 to determine which one of the first data D1 and the second data D2 is selected as the specific data to be outputted, and generates a record data D_REC;

Step 330: The ECC module 1215 receives the specific data and the record data D_REC, and generates a third data D3 by executing an ECC protection upon the received specific data and the record data D_REC;

Step 335: The randomizer 1220 executes data shaping upon bits included in the third data D3;

Step 340: Store the shaped data pattern into the flash memory device 105; and

Step 345: End.

Those skilled in the art will readily observe that numerous modifications and alterations of the device and method may be made while retaining the teachings of the invention.

What is claimed is:

1. A controlling method utilized in a flash memory device, comprising:
    compressing a first data received from a host to generate a second data;
    generating a record data according to the first data and the second data, wherein the record data records at least error correct coding (ECC) control information;
    generating a third data by executing an ECC protection and data shaping of a randomizer upon the record data and at least a specific data selected from the first data and the second data according to the record data; and
    writing the third data into the flash memory device;
    wherein the record data records compressing indication information and the at least ECC control information; the compressing indication information records that the at least a specific data is a compressed data and a compression ratio; and, the at least ECC control information records a bit number of an ECC code utilized in the ECC protection.

2. The controlling method of claim 1, wherein the step of generating the record data according to the first data and the second data comprises:
    comparing the first data and the second data, for determining which one of the first data and the second data is selected as the specific data; and
    referring the determined specific data to generate the record data accordingly.

3. The controlling method of claim 1, wherein the first data and the second data respectively have a first data amount and a second data amount; the ECC protection is a dynamic ECC protection; when a difference value between the first data amount and the second data amount is smaller than a specific difference value, the bit number of the ECC code utilized in the dynamic ECC protection is smaller than a specific bit number; and when the difference value between the first data amount and the second data amount is larger than the specific difference value, the bit number of the ECC code utilized in the dynamic ECC protection is larger than the specific bit number.

4. The controlling method of claim 3, wherein the third data has a third data amount which is equal to a data amount generated by executing a basic ECC protection upon the first data.

5. The controlling method of claim 1, wherein the step of generating the record data according to the first data and the second data comprises:
    determining the ECC control information according to a comparing result of the first data and the second data and importance of the first data and the second data.

6. The controlling method of claim 1, wherein the step of generating the third data comprises:
    executing the ECC protection upon the specific data and the record data to generate the third data according to importance of the specific data and the ECC control information.

7. A controlling method utilized in a flash memory device, comprising:
    reading a third data from the flash memory device, the third data including a record data, the record data recording compressing indication information and ECC control information;
    generating a second data by executing ECC decoding and reverse data shaping of a de-randomizer according to the recorded ECC control information and the third data; and
    decompressing the second data to generate a first data to a host or outputting the second data to the host according to the recorded compressing indication information;
    wherein the compressing indication information records that the first data is a compressed data and a compression ratio, and the ECC control information records a bit number of an ECC code utilized in the ECC decoding.

8. The controlling method of claim 7, further comprising:
    reading a fourth data from the flash memory device, a record data included in the fourth data recording ECC control information, wherein the ECC control information of the fourth data and the ECC control information of the third data respectively indicate different ECC bit numbers.

9. A controller utilized in a flash memory device, comprising:
    a first processing circuit, for compressing a first data received from a host to generate a second data, and generating a record data according the first data and the second data, wherein the record data records at least ECC control information and compressing indication information; and
    a second processing circuit, coupled to the first processing circuit, for generating a third data by executing an ECC protection and a data shaping of a randomizer upon the record data and a specific data selected form the first data and the second data according to the record data, and writing the third data into the flash memory device;
    wherein the compressing indication information records that the at least a specific data is a compressed data and a compression ratio; and the at least ECC control information records a bit number of an ECC code utilized in the ECC protection.

10. The controller of claim 9, wherein the first processing circuit compares the first data and the second data for determining which one of the first data and the second data is selected as the specific data, and refers to the determined specific data to generate the record data accordingly.

11. The controller of claim 9, wherein the first data and the second data respectively have a first data amount and a second data amount; the ECC protection is a dynamic ECC protection; when a difference value between the first data amount and the second data amount is smaller than a specific difference value, the bit number of the ECC code utilized in the dynamic ECC protection is smaller than the specific bit number; and when the difference value between the first data amount and the second data amount is larger than the specific difference value, the bit number of the ECC code utilized in the dynamic ECC protection is larger than the specific bit number.

12. The controller of claim 11, wherein the third data has a third data amount equal to a data amount generated by executing a basic ECC protection upon the first data.

13. The controller of claim 9, wherein the first processing circuit determines the ECC control information according to a comparing result of the first data and the second data and importance of the first data and the second data.

14. The controller of claim 9, wherein the second processing circuit generates the third information by executing the ECC protection and the data shaping of the randomizer upon the record data and the specific data selected from the first data and the second data according to importance of the specific data and the ECC control information.

15. A controller utilized in a flash memory device, comprising:
   a second processing circuit, for reading a third data from the flash memory device, wherein the third data includes a record data, and the record data records compressing indication information and ECC control information, and for generating a second data by executing ECC decoding and reverse data shaping of a de-randomizer according to the recorded ECC control information and the third data; and
   a first processing circuit, coupled to the second processing circuit, for decompressing the second data to generate a first data to a host or outputting the second data to the host according to the recorded compressing indication information;
   wherein the compressing indication information records that the first data is a compressed data and a compression ratio; and, the ECC control information records a bit number of an ECC code utilized in the ECC decoding.

16. The controller of claim 15, wherein the second processing circuit reads a fourth data from the flash memory device, the fourth data includes a record data which records ECC control information, the ECC control information of the fourth data and the ECC control information of the third data respectively indicate different ECC bit numbers.

17. An access method utilized in a memory device, comprising:
   receiving a first data;
   compressing the first data to generate a second data;
   selectively utilizing the first data or the second data as a specific data according to a compression ratio of the second data; and
   generating a third data by executing an ECC protection and data shaping of a randomizer upon the specific data and a record data according to the compression ratio, wherein the third data is for being recorded into the memory device;
   wherein the record data records compressing indication information and ECC control information; the compressing indication information records that the specific data is a compressed data and the compression ratio; and, the ECC control information records a bit number of an ECC code utilized in the ECC protection.

18. The method of claim 17, wherein the step of generating the third data by executing the ECC protection and the data shaping of the randomizer upon the specific data and the record data according to the compression ratio comprises:
   determining a degree of the ECC protection according to the compression ratio.

* * * * *